United States Patent
Kiyokawa

(10) Patent No.: US 6,218,849 B1
(45) Date of Patent: Apr. 17, 2001

(54) DEVICE FOR DETECTING PROPER MOUNTING OF AN IC FOR TESTING IN AN IC TESTING APPARATUS

(75) Inventor: Toshiyuki Kiyokawa, KuKi (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/060,270

(22) Filed: Apr. 14, 1998

(30) Foreign Application Priority Data

Apr. 18, 1997 (JP) .................................................. 9-101672

(51) Int. Cl.⁷ .................................................. G01R 31/02
(52) U.S. Cl. .................................................. 324/755; 758/165
(58) Field of Search .................................................. 324/754, 755, 324/757, 758, 765; 356/237.1, 237.5; 33/533; 439/68, 70

(56) References Cited

U.S. PATENT DOCUMENTS

| | | | |
|---|---|---|---|
| 4,553,843 | 11/1985 | Langley et al. | 358/101 |
| 4,686,565 | 8/1987 | Ando | 356/375 |
| 4,704,700 | * 11/1987 | Linker et al. | 382/146 |
| 4,800,335 | * 1/1989 | Davila et al. | 324/757 |
| 5,572,139 | * 11/1996 | Kelley | 324/538 |

FOREIGN PATENT DOCUMENTS

| | | |
|---|---|---|
| 64-74800 | 3/1989 | (JP) . |
| 2-189000 | 7/1990 | (JP) . |
| 96 22673 | 7/1996 | (WO) . |

* cited by examiner

*Primary Examiner*—Safet Metjahic
*Assistant Examiner*—Russell M. Kobert
(74) *Attorney, Agent, or Firm*—Gallagher & Lathrop; David N. Lathrop

(57) ABSTRACT

An IC testing apparatus which overcomes the shortcoming of the prior art by permitting a recognition of the attitude of an IC being measured in a proper manner to each variety of IC's in a simple and facilitated manner is disclosed. IC testing apparatus includes a handler on which an IC socket and a socket guide, which is centrally formed with a square opening into which the IC socket is fitted, are mounted. A projected light guide having a light radiating end on which a light reflecting surface is formed is embedded in the socket guide. A received light guide having a light incident end on which a light reflecting surface is formed is also embedded in the socket guide in parallel relationship with the projected light guide. A light projector element is disposed in opposing relationship with the projected light guide, and a light receptor element is disposed in opposing relationship with the received light guide.

16 Claims, 3 Drawing Sheets

DEVICE FOR DETECTING PROPER MOUNTING OF AN IC FOR TESTING IN AN IC TESTING APPARATUS

BACKGROUND OF THE INVENTION

The invention relates to an IC testing apparatus, and in particular, to an IC testing apparatus which is provided with a positioned status recognition apparatus on a handler for inspecting the attitude of an IC, which is a device to be measured, as it is seated on a contact assembly of an IC socket.

An IC testing apparatus comprises a mechanism, generally referred to as a handler, which mounts IC's to be tested on an IC socket of the testing apparatus successively and which classifies tested IC's on the basis of test results, and a testing apparatus proper which applies a test signal to an IC to be tested in order to perform an electrical test. Detachably mounted on the handler is a socket guide on which an IC socket having an IC to be tested carried thereon is mounted. The IC socket 2 and the socket guide 3 on which it is mounted vary depending on the variety of an IC to be tested. Accordingly, when IC's of different varieties are to be tested, it is necessary to change the IC socket 2 and the socket guide 3. A conventional example will be described with reference to FIG. 3.

In FIG. 3, there is shown an IC socket 2 which is substantially rectangular in its outer configuration and which is mounted on a socket guide 3, which is in turn mounted on the base of a handler. An IC abutment 20 has a cross section in the horizontal plane which is rectangular in a manner corresponding to the outer configuration of an IC, having pairs of opposing sides which run parallel to each other. When an ICI which is held attracted by an attraction pad, not shown, is dropped onto the IC abutment 20, the orientation of the IC is defined by the latter. Specifically, the IC abutment has a bottom surface 21, a pair of bevelled lateral guide taper surfaces 22X and a pair of bevelled longitudinal guide taper surfaces 22Y guiding the dropped IC1 so that its lower surface 13 is brought into proper contact with the bottom surface 21 of the IC abutment 20, the respective pair of surfaces being parallel to each other. The attraction head which holds the IC attracted thereto is positioned above the IC abutment and is then driven downward, followed by releasing the suction applied to allow the IC1 to drop onto the IC abutment. IC1 has terminal pins 11, the free ends of which then contact the longitudinal guide taper surfaces 22Y, while the outer casing 12 of the IC1 contacts the lateral guide taper surfaces 22X. In this manner, IC1 moves down while being guided by these guide taper surfaces, and if it comes to a stop with the lower surface 13 of IC1 in proper contact with the bottom surface 21 of the IC abutment 20, the terminal pins 11 of IC1 are positioned on a socket contact assembly 24 (see FIG. 2) at the same time therewith. The socket contact assembly 24 is connected to an IC testing apparatus proper through an adaptor socket 5, a socket board or a performance board 6.

A positioned status recognition apparatus which inspects whether or not IC1 is properly positioned on the IC abutment 20 of the IC socket 2 utilizes a light transmission type sensor comprising a light projector element 41 and a light receptor element 42 which receives the light projected by the light projector element 41. In the prior art, as shown in FIG. 3, the light projector element 41 is inserted into a through-opening 3TL formed in the socket guide 3 and disposed to the left of IC1 to be measured while the light receptor element 42 is inserted into a through-opening 3TR formed in the socket guide and disposed to the right of the IC1 to be measured. When the light projector element 41 projects light, the light will be interrupted by IC1, if it exists, and thus the light cannot be received by the light receptor element 42. By contrast, in the absence of IC1, the light projected by the light projector element 41 directly impinges on the light receptor element 42, allowing the absence of IC1 to be recognized.

In a conventional arrangement, in order to allow different varieties of IC's to be tested, it is necessary that the light projector element 41 and the light receptor element be removed from the through-openings 3TL, 3TR in the IC socket 2 and the socket 3 which are currently used, the set of IC sockets 2 and socket guide 3 be changed to one which is commensurate with the variety of an IC which is to be tested next and which is then mounted on the base of a handler, and the light projector element 41 and the light receptor element 42 be again mounted in the through-openings 3TL, 3TR in the changed socket guide 3, causing an inconvenience.

SUMMARY OF THE INVENTION

It is an object of the invention to provide an IC testing apparatus which permits an easy replacement of a socket guide having an IC socket in accordance with the variety of an IC to be tested and which eliminates the need for removal/insertion of a light projector and a light receptor element.

In accordance with the invention, there is provided an IC testing apparatus including a handler on which an IC socket and a socket guide on which the IC socket is centrally mounted are mounted, and comprising
 a projected light guide embedded in the socket guide and having a light incident end which is located on the peripheral edge of the socket guide and having a light radiating end on which a light reflecting surface is formed;
 a received light guide embedded in the socket guide in parallel relationship with the projected light guide and having a light incident end on which a light reflecting surface is formed;
 a light projector element disposed on the handler in opposing relationship with the projected light guide;
 and a light receptor element disposed on the handler in opposing relationship with the received light guide.

The IC testing apparatus may include a single set of projected light guide and received light guide.

In the IC testing apparatus, the projected light guide may be formed by a pair of mutually adjacent, parallel projected light guides having different lengths and the received light guide may be formed by a pair of mutually adjacent, parallel received light guides having different lengths. The difference in the length between the pair of mutually adjacent, parallel projected light guides and the difference in the length between the pair of mutually adjacent, parallel received light guides may be chosen in a manner corresponding to the size of the outer configuration of an IC being measured.

In the IC testing apparatus, a further projected light guide which is embedded in the socket guide 3 in orthogonal relationship to the projected light guide mentioned above, a further received light guide embedded in the socket guide 3 in parallel relationship with the further projected light guide, a light projector element disposed in an opposing relationship with the further projected light guide, and a light receptor element disposed in an opposing relationship with the further received light guide may be provided.

In the IC testing apparatus, either one of a set of the first mentioned projected light guide and received light guide or another set of the further projected light guide and received light guide may be formed by a set of a pair of mutually adjacent, parallel projected light guides having different lengths and a pair of mutually adjacent, parallel received light guides having different lengths. In the IC testing apparatus, the difference in the length between the pair of mutually adjacent, parallel projected light guides and the difference in the length between the pair of mutually adjacent, parallel received light guides may be chosen in a manner corresponding to the size of the outer configuration of an IC being measured.

In the IC testing apparatus, both the set of the first mentioned projected light guide and received light guide and the set of the further projected light guide and received light guide may be formed each by a set of a pair of mutually adjacent, parallel projected light guides having different lengths, and a pair of mutually adjacent, parallel received light guides having different lengths. In the IC testing apparatus, the difference in the length between the pair of mutually adjacent, parallel projected light guides and the difference in the length of mutually adjacent, parallel received light guides may be chosen in a manner corresponding to the size of the outer configuration of an IC being measured.

DETAILED DESCRIPTION OF THE PREFERRED EMBODIMENT

Figure 1:
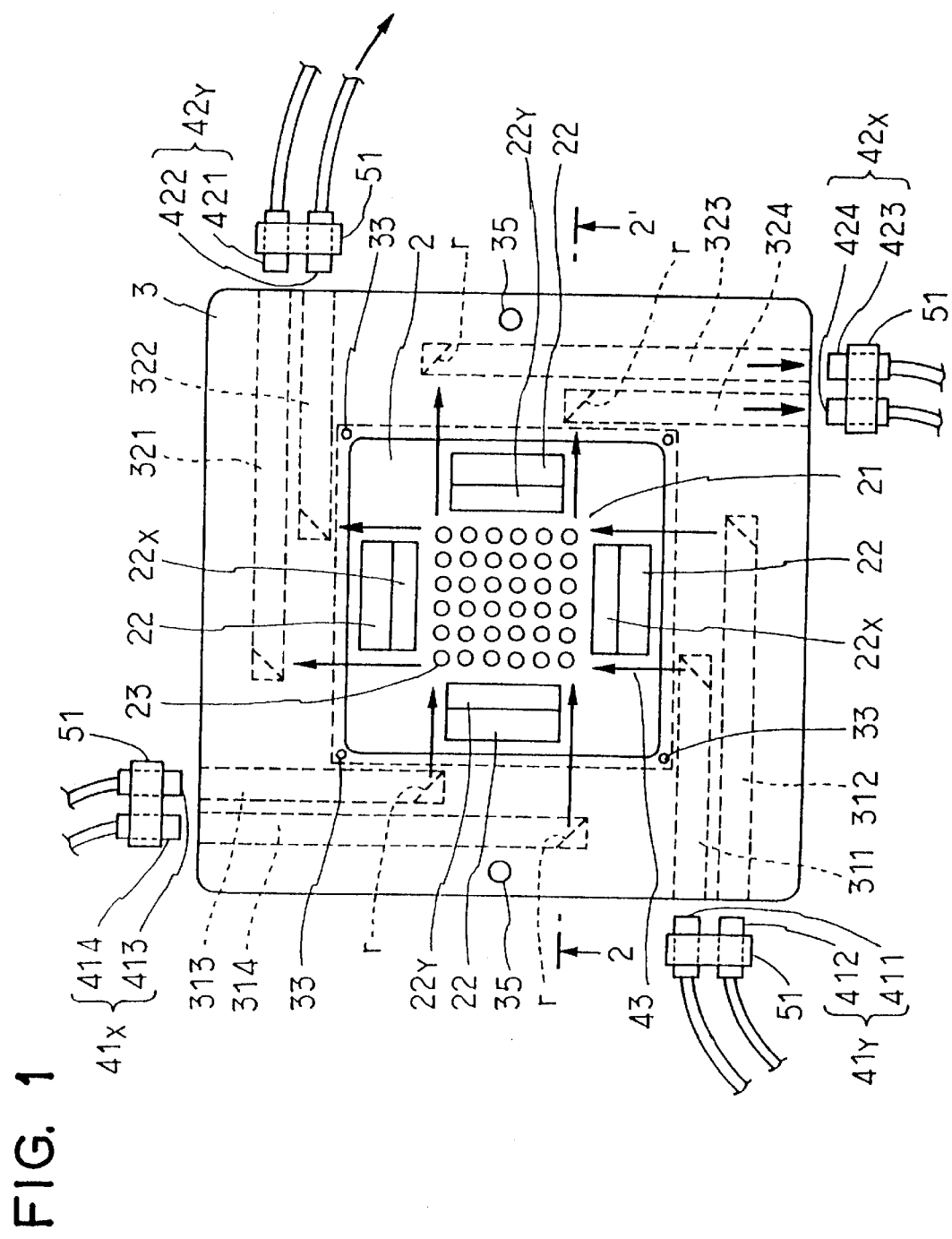
FIG. 1 is a schematic view showing an embodiment of the invention.

An embodiment of the invention will be described with reference to FIGS. 1 and 2. FIG. 1 is a top view of the embodiment, and FIG. 2 is a cross section taken along the line 2—2' shown in FIG. 1 as viewed in a direction indicated by an arrow.

Figure 2:
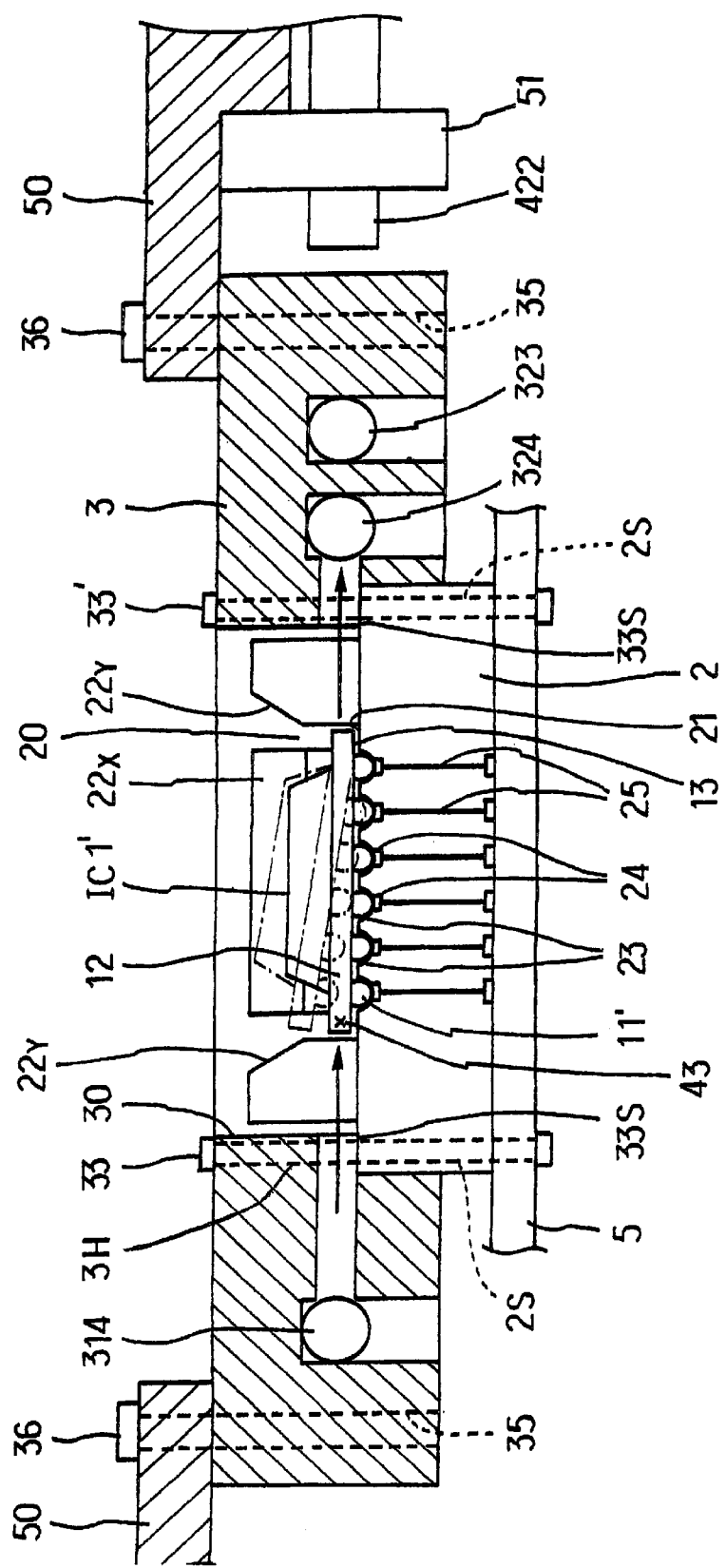
FIG. 2 is a cross section taken along the line 2—2' shown in FIG. 1 and as viewed in a direction indicated by an arrow.

Referring to FIGS. 1 and 2, there are shown a substantially square IC socket 2 and a socket guide 3. The socket guide 3 is centrally formed with a substantially square slot 30 which is smaller than the IC socket 2. Toward its bottom, the square slot 30 is enlarged to a greater size which accommodates for the IC socket 2, thus forming a step 33S. The socket guide 3 is positioned and secured in a base 50 of a handler with the IC socket 2 fitted into the square slot 30, by fitting guide pins 36 into guide holes 35 formed in the socket guide 3. In the present embodiment, the IC socket 2 is shown as BGA IC (ball grid array) IC socket. At locations adjacent to the four corners of the square slot 30, the socket guide 3 is formed with the through-holes 3H reaching the step 33S, and a through-hole 2S having an axis which is aligned with the axis of the through-hole 3H is formed in the IC socket 2 and a socket board 5. Screws 33 pass through the through-holes 3H and corresponding through-holes 2S, thus securing the IC socket 2 to the socket guide 3.

Solder balls 11' acting as IC terminals are formed on the lower surface of BGAIC in a matrix array. Prism-shaped guide blocks 22 are fixedly mounted on the upper surface of the IC socket 2 along mutually opposing sides in a region outside the matrix array of recesses 23 which receive the solder balls on the BGAIC: The guide blocks 22 which oppose each other have an equal length, and their opposing surfaces are formed as guide taper surfaces 22X, 22Y to provide a spacing therebetween which increases in the upward direction. One pair of opposing guide blocks 22 have a length which is less than the spacing between the other pair of opposing guide blocks 22, and are disposed at an equal distance to the guide blocks of the other pair. A space substantially surrounded by the guide taper surfaces 22X, 22Y on the four guide blocks 22 defines the IC abutment 20. Accordingly, the cross-sectional configuration of the IC abutment 20 in the horizontal plane is a square similar to the outer configuration of the IC, and its four corners are left open.

A BGA IC 1' which is held attracted by an attraction pad, not shown, has its orientation defined by the IC abutment 20 when it is dropped onto the IC abutment 20. Specifically, the IC abutment 20 has a bottom surface 21, a pair of bevelled lateral guide taper surfaces 22X and a pair of bevelled longitudinal guide taper surfaces 22Y for guiding the dropped IC1' so that the lower surface 13 of IC1' is brought into proper contact with the bottom surface 21 of the IC abutment 20, the respective pair of guide taper surfaces being parallel to each other.

The attraction pad which holds IC1' attracted thereto is positioned above the IC abutment 20 and then driven downward, followed by releasing the suction applied to allow IC1' to drop.

The outer casing 12 of the dropped IC1' contacts the longitudinal guide taper surfaces 22Y and also contacts the lateral guide taper surfaces 22X, allowing IC1' to move down while being guided by these guide taper surfaces. When the BGAIC1' comes to a stop with its lower surface 13 in proper contact with the bottom surface 21 of the IC abutment 20, the solder balls 11' on the IC1' are positioned in the ball receiving recesses 23 at the same time therewith, allowing the solder balls 11' to be in contact with individual socket contacts 24. It will be seen that thirty-six ball receiving recesses 23 are formed in a matrix form in the bottom surface 21 of the IC abutment 20. Each of the socket contacts 24 is connected through its contacting resilient pin 25 to a socket board 5, and is then connected to the IC testing apparatus proper through a socket board, performance board or other path. A guide hole 35 is formed in the socket guide 3 to permit it to be mounted on the base 50 of handler of the IC testing apparatus, and is engaged by a guide pin 36 extending from the handler.

In the present embodiment, a positioned status recognition apparatus which inspects whether or not IC1' is properly positioned onto the IC abutment 20 of the BGA IC socket 2 utilizes a light transmission type sensor which comprises a light projector element 41 and a light receiving element 42 which receives the light projected by the light emitting element. In FIGS. 1 and 2, a total of four pairs of light projector elements 41 and light receptor elements 42 which receive the projected light therefrom are provided. Specifically, a pair of first light projector element 411 and first light receptor element 421 which receives the projected light from the projector 411, a pair of second light projector element 412 and second light receptor element 422 which receives the projected light from the projector 412, a pair of third light projector element 413 and a third light receptor element 423 which receives the projected light from the projector 413, and a pair of fourth light projector element 414 and fourth light receptor element 424 which receives the projected light from the projector 414 are provided.

The first light projector element 411 and the second light projector element 412 form together a Y light projector pair 41Y while the third light projector element 413 and the fourth light projector element 414 form together an X light projector element pair 41X. Similarly, the first light receptor element 421 and the second light receptor element 422 form together a Y light receptor element pair 42Y while the third light receptor element 423 and the fourth light receptor element 424 form together an X light receptor element pair 42X. The two light projector element pairs and the two light receptor element pairs are mounted on the handler of IC testing apparatus at locations close and opposite to respective light incident ends and light radiating ends of two pairs of projected light guides 31 and two pairs of received light guides 32 around the peripheral edge of the socket guide 3.

A light path from the light projector element 41 to the light receptor element 42 will be described.

Light guides which form part of the light path from the light projector element 41 to the light receptor element 42 are embedded in the socket guide 3. Specifically, first and second projected light guides 311, 312 having light incident ends which are disposed in opposing relationship with the first and the second light projector element 411, 412, respectively, are embedded in the socket guide 3, and extend in the X direction along one side of the socket guide 3. The light radiating ends of these projected light guides are located adjacent to the periphery of the IC socket at a first X position which is aligned with the leftmost column of the matrix array of ball receiving recesses 23 and at a second X position which is aligned with the rightmost column of the matrix array.

Third and fourth projected light guides 313, 314 having light incident ends which are disposed in opposing relationship with the third and the fourth light projector element 413, 414, respectively, are embedded in the socket guide 3, and extend in the Y direction along one side of the socket guide 3. The light radiating ends of these projected light guides are located adjacent to the peripheral edge of the IC socket at a first Y position which is aligned with the uppermost row of the matrix array of ball receiving recesses 23 and at a second Y position which is aligned with the lowermost row of the matrix array.

In this manner, the projected light guides within each pair of light guides 311, 312 and 313, 314, which are disposed in opposing relationship with the Y light projector element pair 41Y and the X light emitting pair 41X, respectively, have different lengths between them. Instead of employing a pair of light projector elements for the Y light projector element pair 41Y and the X light projector pair 41X, each of them may comprise a single light projector element in design.

First and second received light guides 321, 322 having light radiating ends which are disposed in opposing relationship with the first and the second light receptor element 421, 422, respectively, are embedded in the socket guide 3, and extend in the X direction along the other side of the socket guide 3. The light incident ends of these received light guides are located adjacent to the peripheral edge of the IC socket 2 at a first X position which is aligned with the leftmost column of the matrix array of ball receiving recesses 23 and at a second X position which is aligned with the rightmost column of the matrix array.

Third and fourth received light guides 323, 324 having light radiating ends which are disposed in opposing relationship with the third and the fourth light receptor element 423, 424, respectively, are embedded in the socket guide 3, and extend in the Y direction along the other side of the socket guide 3. The light incident ends of these received light guides are located adjacent to the peripheral edge of the IC socket 2 at a first Y position which is aligned with the uppermost row of the matrix array of ball receiving recesses 23 and at a second Y position which is aligned with the lowermost row of the matrix array.

It will be seen that the received light guides 32 which oppose each of the Y light receptor element pair 42Y and the X light receptor pair 42X have different lengths.

The light radiating end of the projected light guide 31 and the light incident end of the received light guide 32 are each formed with a light reflecting surface r which forms an angle of 45° preferably with respect to the lengthwise direction of each light guide. The light guide may be formed of an optical glass, and the light reflecting surface r can be easily obtained by grinding and polishing the free end thereof at an angle of 45° with respect to the lengthwise direction.

A sensor optical axis for the radiation from the projected light guide 311 is shown at 43. The sensor optical axis is chosen in elevation to lie above the upper surface 21 of the IC socket 2, (or the bottom surface 21 of the IC abutment 20) but below the elevation of the IC, preferably, at a level below one-half the elevation of the IC so that when an IC to be tested is properly mounted on the IC socket 2, light passing through the space which is occupied by the IC impinges on the light incident end of the received light guide, thus enabling any slight abnormality in the attitude of the IC to be detected.

Light radiated from the first light projector element 411 impinges on the first projected light guide 311 which is disposed in opposing relationship therewith, reflected by the light reflecting surface r at the free end thereof to have its path bent through an angle of 90° before being radiated, impinges on the light reflecting surface r at the free end of the first received light guide 321 where it is reflected to have its path bent through an angle of 90° and transmits through the light guide 321 to be radiated from its end to be incident on the first light receptor element 421 which is disposed in an opposing relationship therewith. Similarly, the light radiated from the second light projector element 412 impinges on and received by the second light receptor element 422. Also, the light radiated from the third light projector element 413 and the fourth light projector element 414 is similarly received by the third light receptor element 423 and the fourth light receptor element 424, respectively.

A sequence of assembly will now be described. Initially, the Y light projector element pair 41Y, the X light projector element pair 41X, the Y light receptor element pair 42Y, and the X light receptor element pair 42X are mounted on the base 50 of the handler by using mounting members 51. These pairs are mounted using a spacing therebetween which permits a socket guide having a maximum size for its outer configuration which is expected to be possible for use as the socket guide 3 to be positioned and fixed among these four pairs. In this manner, a positional relationship is established such that light radiated from the Y light projector element pair 41Y impinges on the first projected light guide 311 and the second projected light guide 312, light radiated from the X light projector element pair 41X impinges on the third light projected guide 313 and the fourth projected light guide 314 while light radiated from the first received light guide 321 impinges on the first light receptor element 421, light radiated from the second received light guide 322 impinges on the second light receptor element 422, light radiated from the third received light guide 323 impinges on the third light receptor element 423, and light radiated from the fourth received light guide 324 impinges on the fourth light receptor element 424. Subsequently, the level of BGA IC socket 2 is adjusted relative to the socket guide 3.

In the IC testing apparatus which is provided with the positioned status recognition apparatus which is constructed in the manner mentioned above to inspect the attitude of an IC, being a device to be measured, which is seated on contacts on the IC socket, when light is radiated from the light projector element pair, the light will be interrupted by IC1', if it is present on the IC abutment, to prevent the light receptor elements from receiving the light. By contrast, if IC1' is absent, the light radiated from the light projector pair directly impinges on and is received by the light receptor element, allowing a recognition that IC1' does not exist on the IC abutment 20.

In the foregoing description, light projectors 411, 412, 413, 414 may each comprise an optical system including a lens or lenses which converges light derived from a light emitting element provided on a handler, not shown, through an optical fiber into a thin beam to be projected into the light incident end of the projected light guide. Alternatively, each projector itself may comprise a light emitting element and a projection lens and electric power may be fed to the light emitting element from the handler. Similarly, light receptors 421, 422, 423, 424 may each comprise a lens and a light incident end portion of an optical fiber so that the received light may be transmitted through the optical fiber to a photo detector provided on the handler (not shown). Alternatively, each light receptor may comprise a lens and a photo detector so that a detected signal may be transmitted to the handler.

Figure 3:
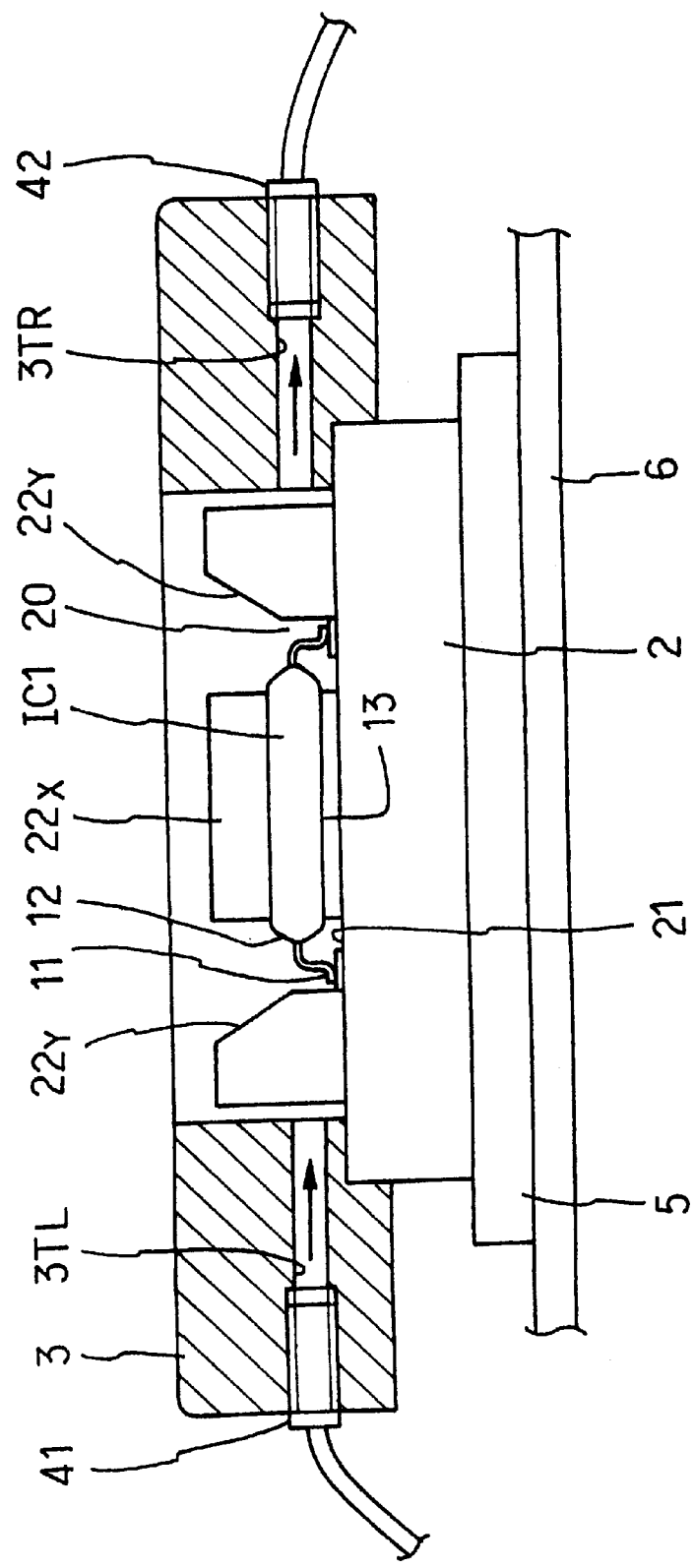
FIG. 3 is a schematic illustration of a conventional example.

The IC socket described with reference to FIGS. 1 and 2 is for mounting an IC of BGA type. For IC of the type shown in FIG. 3 and for other types of IC's, the lengths of projected light guides 311, 312, 313, 314 and received light guides 321, 322, 323, 324 are predetermined in accordance with the size of the outer configuration and the terminal array of the associated IC, and socket guides 3 are previously provided which internally contain such light guides. When the socket guides are so constructed, the spacing between two light guides which form together a pair for each pair of light projectors and/or light receptors may be fixed irrespective of any variety of IC's and can be chosen equal to a preset spacing between the pair of light projectors.

EFFECTS OF THE INVENTION

As described, in accordance with the invention, when the variety of an IC which is a device being measured is changed, what is required is a selection of only the socket guide 3, without requiring a removal of the light projector element pair and the light receptor element pair, the socket guide 3 selected having projected light guides and received light guides embedded therein which have lengths corresponding to the varying configurations and sizes of IC's. There is no need to change the design and the mounting position of the light projector element pair and the light receptor element pair. When light guides are used which are formed with light reflecting surface r at the light radiating end for the projected light guide and at the light incident end for the received light guide, all that is required is the provision of socket guides having light guides of predetermined lengths depending on the varieties of IC's. By choosing the difference in the length between the pair of adjacently embedded projected light guides and the difference in the length between the pair of adjacently embedded received light guides to be slightly less than the size of the outer configuration of IC, the provision of socket guides 3 which are commensurate with the varieties of IC's provides the only requirement. By providing two or more light transmission type sensors operating in different directions any tilting of an IC in any orientation on the IC socket could be detected, as an abnormal attitude with an increased reliability advantageously.

What is claimed is:

1. An IC testing apparatus including a handler which successively mounts an IC to be tested on an IC socket and which moves the tested IC away therefrom, comprising
    a socket guide detachably mounted on the handler;
    an IC socket centrally mounted on the socket guide and on which an IC to be tested is mounted;
    projected light guide means having a light incident end located on the peripheral edge of the socket guide for guiding incident light and radiating light through a space that is occupied by the IC to be tested when the IC is mounted on the socket;
    received light guide means having a light incident end located adjacent to the peripheral edge of the IC socket to receive the light that has passed through the space that is occupied by the IC when the IC is mounted, for guiding the received light and having a light radiating end through which the received light is radiated at the peripheral edge of the socket guide;
    light projector means secured to the handler and having a light projecting end which is spaced from and opposes the light incident end of the projected light guide means;
    and light receptor means secured to the handler and having a light receiving end which is spaced from and opposes the light radiating end of the received light guide means.

2. An IC testing apparatus according to claim 1 in which a single projected light guide and a single received light guide are provided.

3. An IC testing apparatus according to claim 2 in which the projected light guide comprises a pair of mutually adjacent, parallel projected light guides having different lengths and the received light guide comprises a pair of mutually adjacent, parallel received light guides having different lengths.

4. An IC testing apparatus according to claim 3 in which a difference in the length between the pair of mutually adjacent, parallel projected light guides and a difference in the length between the pair of mutually adjacent, parallel received light guides are chosen in a manner corresponding to the size of an outer configuration of an IC being measured.

5. An IC testing apparatus according to claim 2, further comprising
    a further projected light guide embedded in the socket guide so as to extend in a direction different from the extending direction of the first mentioned projected light guide;
    a further received light guide embedded in the socket guide so as to extend in a direction different from the extending direction of the received light guide means;
    further light projector means secured to the handler and disposed close to and in an opposing relationship with the light incident end of the further projected light guide;
    and further light receptor means secured to the handler and disposed close to and in an opposing relationship with the light radiating end of the further received light guide.

6. An IC testing apparatus according to claim 5 in which either one of a set of the first mentioned projected light guide and received light guide and another set of the further projected light guide and received light guide comprises a set of a pair of mutually adjacent, parallel projected light guides having different lengths and a pair of mutually adjacent, parallel received light guides having different lengths.

7. An IC testing apparatus according to claim 6 in which the difference in the length between the pair of mutually adjacent, parallel projected light guides and the difference in the length between the pair of mutually adjacent, parallel received light guides are chosen in a manner corresponding to the size of an outer configuration of an IC being measured.

8. An IC testing apparatus according to claim 1 in which the socket guide is centrally formed with a square slot which is greater than the outer configuration of the IC socket toward the lower surface thereof and which is smaller than the outer configuration of the IC socket toward the upper surface thereof, the IC socket being fitted into the square slot on the smaller side.

9. An IC testing apparatus according to claim 1 in which prism-shaped guide blocks are fixedly mounted on the upper surface of the IC socket at locations adjacent to the four sides of the outer configuration of the IC socket, the guide blocks of length less than the lengths of the respective sides of the outer configuration of the IC socket, the guide blocks which oppose each other having their surfaces formed as guide tapered surfaces which have a spacing therebetween which increases in the upward direction.

10. An IC testing apparatus according to claim 1 in which the end of the respective projected light guide means which is located adjacent to the IC socket is provided mirror means which reflects light in a direction different from in which the projected light guide means extends.

11. An IC testing apparatus according to claim 1 in which the outer configuration of the IC socket is substantially a parallelogram and in which the projected and the received light guide means extend along the sides of the IC socket which oppose each other.

12. An IC testing apparatus according to claim 1 in which each of the projected and the received light guide means is formed by a glass rod.

13. An IC testing apparatus according to claim 1 in which the light projector means comprise optical means which acts to converge light transmitted from the handler through an optical fiber so as to irradiate the light incident end of the projected light guide.

14. An IC testing apparatus according to claim 1 in which the light projector means comprises light emitting element means which is fed from the handler to emit light.

15. An IC testing apparatus according to claim 1 in which the light receptor means comprises optical means which acts to condense light radiated from the light radiating end of the received light guide means and to feed such light to the handler through an optical fiber.

16. An IC testing apparatus according to claim 1 in which the light receptor means comprises photo detector means which detects light radiated from the light radiating end of the received light guide means and feeds a detection signal to the handler.

* * * * *